(12) United States Patent
Pelt et al.

(10) Patent No.: US 12,644,925 B2
(45) Date of Patent: Jun. 2, 2026

(54) SUPPLY CHAIN SECURITY FOR CHIPLETS

(71) Applicant: Advanced Micro Devices, Inc., Santa Clara, CA (US)

(72) Inventors: Robert Landon Pelt, Austin, TX (US); Jason Jonathon Moore, Albuquerque, NM (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 18/510,454

(22) Filed: Nov. 15, 2023

(65) Prior Publication Data

US 2025/0155500 A1 May 15, 2025

(51) Int. Cl.
*G01R 31/317* (2006.01)
*G01R 31/28* (2006.01)

(52) U.S. Cl.
CPC ... *G01R 31/31719* (2013.01); *G01R 31/2834* (2013.01); *G01R 31/31727* (2013.01)

(58) Field of Classification Search
CPC .......... G01R 31/31719; G01R 31/2834; G01R 31/31727
See application file for complete search history.

(56) References Cited

U.S. PATENT DOCUMENTS

| | | | |
|---|---|---|---|
| 2004/0025036 A1* | 2/2004 | Balard .................. | G06F 21/575 713/176 |
| 2006/0107057 A1* | 5/2006 | Lewis ................... | H04L 9/3271 713/176 |
| 2009/0315583 A1* | 12/2009 | Rius Vazquez .... | G01R 31/3008 324/754.01 |
| 2018/0069854 A1* | 3/2018 | Chakraborty ......... | H04L 9/3231 |
| 2019/0189236 A1* | 6/2019 | Poliakov ................. | G06N 3/04 |
| 2021/0074680 A1* | 3/2021 | Lin ................ | G01R 31/318505 |

* cited by examiner

*Primary Examiner* — Mark D Featherstone
*Assistant Examiner* — Jeffrey Andrew Yang
(74) *Attorney, Agent, or Firm* — FIG. 1 Patents

(57) ABSTRACT

Supply chain security for chiplets is described. In accordance with the described techniques, a chiplet manufacturing interface obtains first test results, and stores an encrypted version of the first test results in a database accessible by the chiplet manufacturing interface and a chiplet integration interface. The chiplet integration interface obtains second test results from at least one chiplet, retrieves, from the database, the encrypted version of the first test results, decrypts the encrypted version of the first test results to obtain a first hash of the first test results, and selectively integrates the at least one chiplet into an integrated circuit based on a comparison of the first test results and the second test results and a comparison of the first hash and a second hash of the second test results generated by the chiplet integration interface.

20 Claims, 4 Drawing Sheets

100

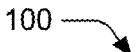
100
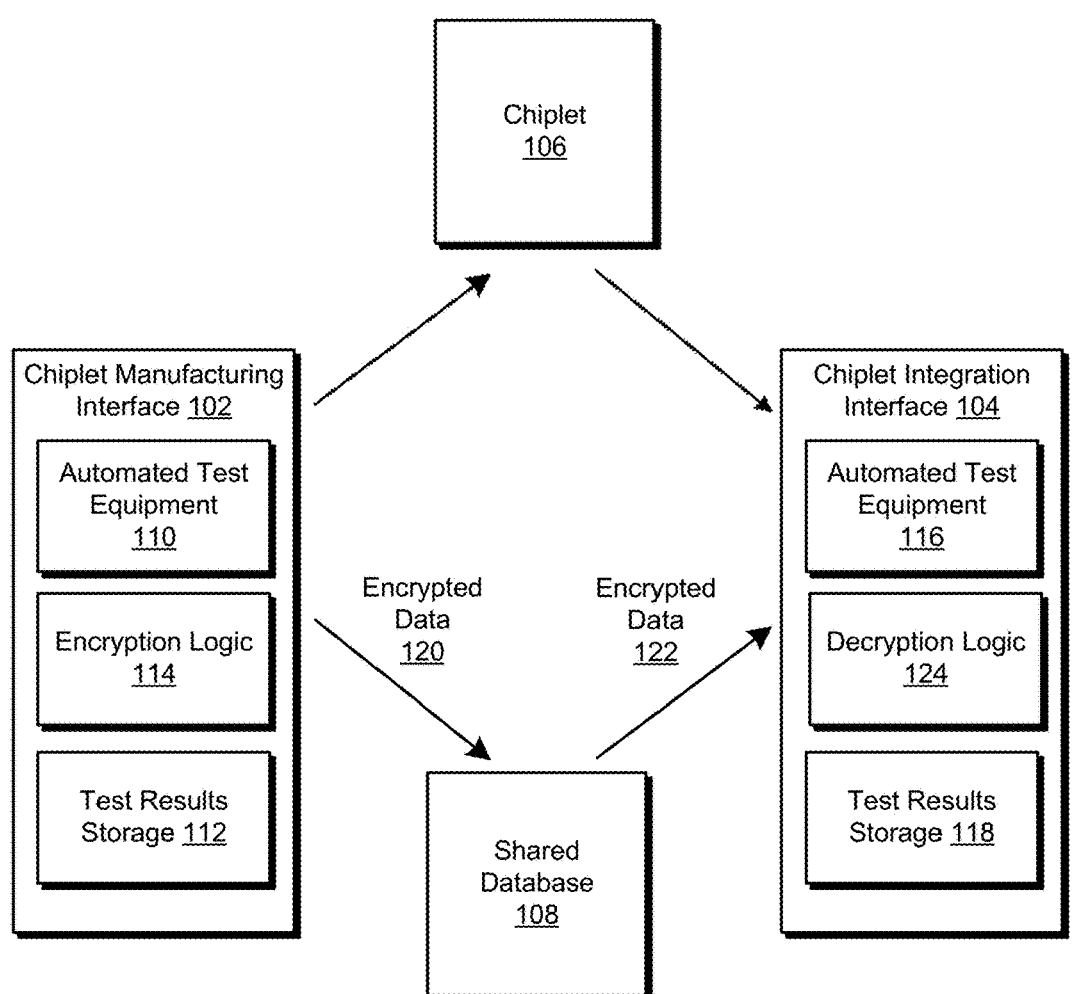
FIG. 1

300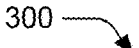

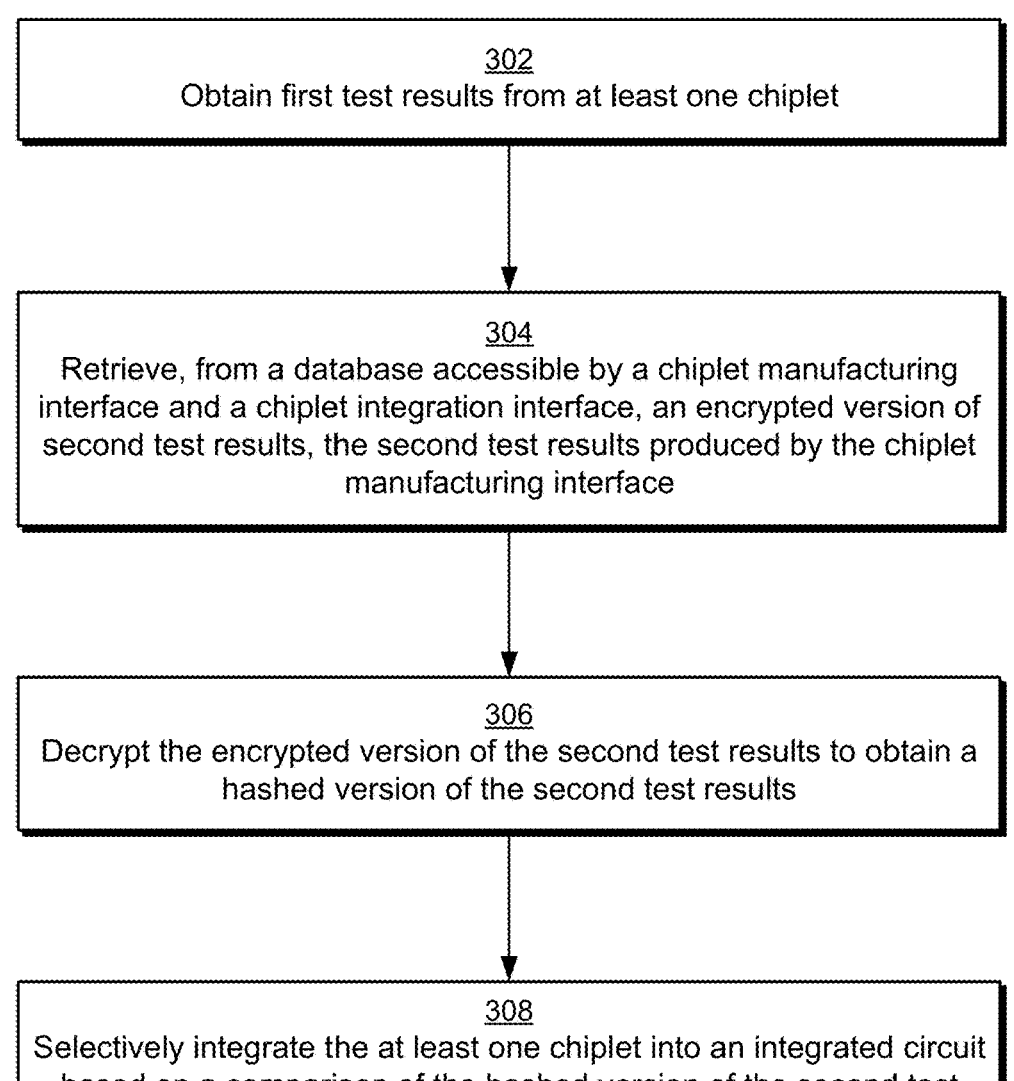

302
Obtain first test results from at least one chiplet

304
Retrieve, from a database accessible by a chiplet manufacturing interface and a chiplet integration interface, an encrypted version of second test results, the second test results produced by the chiplet manufacturing interface 306
Decrypt the encrypted version of the second test results to obtain a hashed version of the second test results 308
Selectively integrate the at least one chiplet into an integrated circuit based on a comparison of the hashed version of the second test results and a hashed version of the first test results

FIG. 3

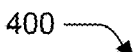
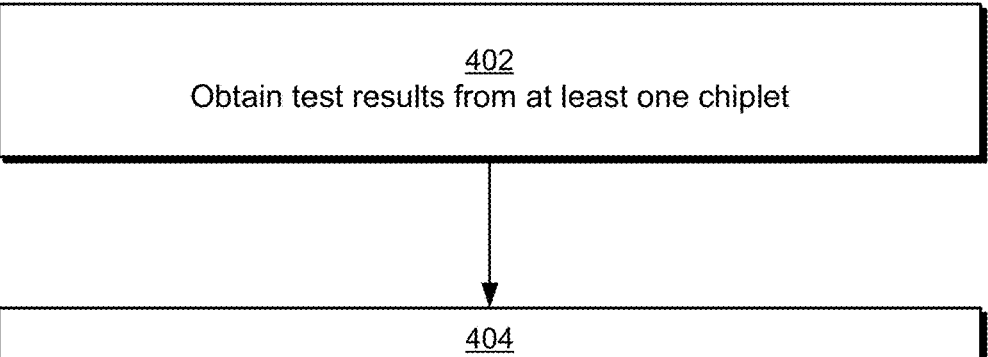
FIG. 4

SUPPLY CHAIN SECURITY FOR CHIPLETS

BACKGROUND

An integrated circuit, or chip, often has a defined functionality that is performed using several independent sets of electronic circuits. For example, the sets of electronic circuits work together to each perform part of the defined functionality. The manufacturing process for the integrated circuit involves manufacturing the sets of electronic circuits separately, which are referred to as chiplets. The chiplets are combined during assembly to form the integrated circuit. Manufacturing the chiplets separately provides for using a single chiplet design for multiple different integrated circuits, which reduces manufacturing costs. Additionally, or alternatively, manufacturing the chiplets separately enables the chiplets to be tested prior to assembly to catch errors at a more granular level.

BRIEF DESCRIPTION OF THE DRAWINGS

FIG. 1 is a block diagram of a non-limiting example system having a database system that provides supply chain security for chiplet manufacturing.

FIG. 3 depicts a procedure in an example implementation of securing a supply chain for chiplets at a chiplet integration interface.

FIG. 4 depicts a procedure in an example implementation of securing a supply chain for chiplets at a chiplet manufacturing interface.

DETAILED DESCRIPTION

Overview

Figure 2:
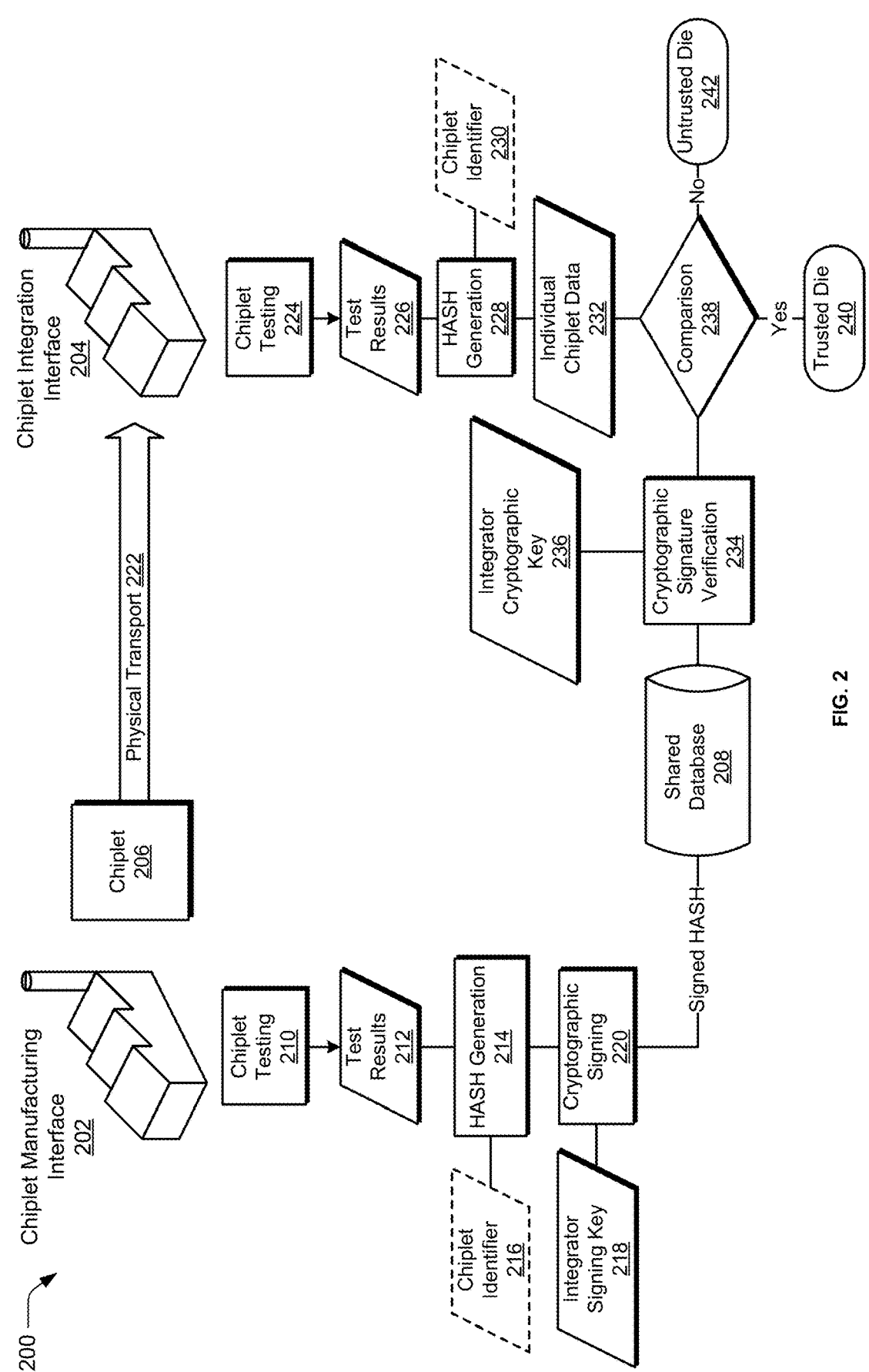
FIG. 2 depicts a non-limiting example in which a chiplet supply chain uses data encryption techniques to securely manufacture an integrated circuit.

In various scenarios, elements of an integrated circuit, such as chiplets, are manufactured independently and assembled, or integrated, after manufacture. For example, the chiplet manufacturing facility is different from the assembly facility, or integration facility, for manufacturing an integrated circuit. In many cases, chiplets are tested for functionality at the manufacturing facility and transported to the separate integration facility. During transport, the chiplets are susceptible to security attacks and/or are susceptible to being replaced with counterfeit chiplets. However, monitoring the chain of custody between the manufacturing facility and the assembly facility incurs high operating costs and potential delays in identifying a security breach. Further, techniques that involve assigning a digital certificate to each chiplet may also be susceptible to security attacks due to the potential of a leak of the certificates, such as from a third party assigning the certificates.

Supply chain security for chiplets is described herein. In one or more implementations, a chiplet manufacturing interface tests each chiplet and records the test results at a secure database. In one or more implementations, the chiplet manufacturing interface includes automated test equipment that performs physical tests on the chiplet, test results storage that includes memory for storing the results of the physical tests, and encryption logic that one or more processors of the chiplet manufacturing interface applies to the results of the physical tests. In some variations, the chiplet manufacturing interface generates a hash of the test results for a chiplet using the test results, and optionally a chiplet identifier unique to each chiplet, as an input to a hash function. In one or more implementations, the chiplet manufacturing interface also encrypts the test results, such as by signing the hash of the test results and the test results using a public key of a public-private key pair assigned to the chiplet manufacturing interface and a chiplet integration interface. The chiplet manufacturing interface stores the encrypted data (e.g., the hash and the test results) in a shared database accessible by the chiplet manufacturing interface and the chiplet integration interface.

In various implementations, the chiplet integration interface receives the chiplets via physical transportation from the chiplet manufacturing interface. For instance, the chiplets are transported to an integration facility at a different geographic location from the chiplet manufacturer, across a property to a different building, or across a same building to a different area for integration, to name just a few examples. The chiplet integration interface tests the chiplets using a same, or similar, testing procedure as the chiplet manufacturing interface. In one or more implementations, the chiplet integration interface includes automated test equipment that performs physical tests on the chiplet, test results storage that includes memory for storing the results of the physical tests, and decryption logic that one or more processors of the chiplet integration interface applies to the results of the physical tests. In some variations, the chiplet integration interface generates a hash of the test results from the tests, and optionally the chiplet identifier, as in input to a hash function. The chiplet integration interface accesses the shared database to obtain the encrypted data that the chiplet manufacturing interface stored in the shared database (e.g., the hash generated by the chiplet manufacturing interface and the test results from the chiplet manufacturing interface). The chiplet integration interface decrypts the hash and the test results from the chiplet manufacturing interface using a private key of the public-private key pair. In some variations, the chiplet integration interface and the chiplet manufacturing interface include the automated test equipment, the storage, and at least one processor for implementing instructions, such as encryption logic or decryption logic, respectively.

The chiplet integration interface compares the decrypted test results from the manufacturing interface to the test results from the chiplet integration interface and the hash from the manufacturing interface to the hash generated by the chiplet integration interface to determine whether the chiplet is trustworthy. If the test results and the hash are relatively similar (e.g., equal or within a threshold similarity), then the chiplet integration interface flags the chiplet as trusted. If the test results and the hash are not relatively similar (e.g., not equal, or not within the threshold similarity), then the chiplet integration interface flags the chiplet as untrusted. The untrusted chiplets are discarded or retested prior to integration into the integrated circuit.

In some aspects, the techniques described herein relate to a system including: a database; and a chiplet integration interface to: receive a first test result from testing at least one chiplet; retrieve, from the database, encrypted data, wherein a first hash associated with a second test result is encrypted in the encrypted data; decrypt the encrypted data; and selectively integrate the at least one chiplet into an integrated circuit based on a comparison of the first test result and the second test result and a comparison of the first hash and a second hash associated with the first test result.

In some aspects, the techniques described herein relate to a system, wherein the chiplet integration interface is further configured to generate, using a hash function, the second hash, wherein an input to the hash function includes the first test result.

In some aspects, the techniques described herein relate to a system, wherein the input further includes a chiplet identifier associated with the at least one chiplet.

In some aspects, the techniques described herein relate to a system, wherein the chiplet integration interface includes: automated test equipment to perform one or more tests on the at least one chiplet, the one or more tests producing the first test result; and decryption logic to decrypt the encrypted data by verifying a cryptographic signature of the encrypted data using a private key of a public and private key pair.

In some aspects, the techniques described herein relate to a system, wherein to selectively integrate the at least one chiplet into the integrated circuit, the chiplet integration interface is configured to integrate the at least one chiplet into the integrated circuit based on a difference between the first test result and the second test result satisfying a first threshold value and a difference between the first hash and the second hash satisfying a second threshold value.

In some aspects, the techniques described herein relate to a system, wherein to selectively integrate the at least one chiplet into the integrated circuit, the chiplet integration interface is configured to cancel integration of the at least one chiplet into the integrated circuit based on at least one of: a difference between the first test result and the second test result failing to satisfy a first threshold value or a difference between the first hash and the second hash failing to satisfy a second threshold value.

In some aspects, the techniques described herein relate to a system, wherein the chiplet integration interface is configured to: receive a third test result from testing the at least one chiplet based on the difference between the first test result and the second test result failing to satisfy the first threshold value or the difference between the first hash and the second hash failing to satisfy the second threshold value; and selectively integrate the at least one chiplet into the integrated circuit based on a comparison of the second test result and the third test result.

In some aspects, the techniques described herein relate to a system, wherein to selectively integrate the at least one chiplet into the integrated circuit, the chiplet integration interface is further configured to retrieve, from the database, the second test result.

In some aspects, the techniques described herein relate to a system, wherein at least one of the first test result or the second test result includes at least one of memory repair measurements, input/output timing measurements, input/output voltage measurements, power consumption curve over temperature measurements, power consumption curve over clock speeds measurements, clock jitter measurements, redundancy setting measurements, internal analog voltage measurements, critical path timing measurements, or phase-locked loop trim measurements.

In some aspects, the techniques described herein relate to a system including: a database; and a chiplet manufacturing interface to: receive a test result from testing at least one chiplet; and store, at the database, encrypted data, wherein a hash associated with the test result is encrypted in the encrypted data, and wherein the stored encrypted data is usable for a determination to integrate the at least one chiplet into an integrated circuit.

In some aspects, the techniques described herein relate to a system, wherein the chiplet manufacturing interface is further configured to generate, using a hash function, the hash associated with the test result, wherein an input to the hash function includes the test result.

In some aspects, the techniques described herein relate to a system, wherein the input further includes a chiplet identifier associated with the at least one chiplet.

In some aspects, the techniques described herein relate to a system, wherein the chiplet manufacturing interface includes: automated test equipment to perform one or more tests on the at least one chiplet, the one or more tests producing the test result; and encryption logic to sign the test result with a public key of a public and private key pair corresponding to the chiplet manufacturing interface and a chiplet integration interface to produce the encrypted data.

In some aspects, the techniques described herein relate to a system, wherein the test result includes at least one of memory repair measurements, input/output timing measurements, input/output voltage measurements, power consumption curve over temperature measurements, power consumption curve over clock speeds measurements, clock jitter measurements, redundancy setting measurements, internal analog voltage measurements, critical path timing measurements, or phase-locked loop trim measurements.

In some aspects, the techniques described herein relate to a method including: receiving a first test result from testing at least one chiplet; retrieving, from a database, encrypted data, wherein a first hash associated with a second test result is encrypted in the encrypted data; decrypting the encrypted data; and selectively integrating the at least one chiplet into an integrated circuit based on a comparison of the first test result and the second test result and a comparison of the first hash and a second hash associated with the first test result.

In some aspects, the techniques described herein relate to a method, further including: generating, using a hash function, the second hash, wherein an input to the hash function includes the first test result.

In some aspects, the techniques described herein relate to a method, wherein the input further includes a chiplet identifier associated with the at least one chiplet.

In some aspects, the techniques described herein relate to a method, further including: decrypting the encrypted data by verifying a cryptographic signature of the encrypted data using a private key of a public and private key pair corresponding to a chiplet manufacturing interface and a chiplet integration interface.

In some aspects, the techniques described herein relate to a method, wherein selectively integrating the at least one chiplet into the integrated circuit includes: integrating the at least one chiplet into the integrated circuit based on a difference between the first test result and the second test result satisfying a first threshold value and a difference between the first hash and the second hash satisfying a second threshold value.

In some aspects, the techniques described herein relate to a method, wherein selectively integrating the at least one chiplet into the integrated circuit includes: canceling integration of the at least one chiplet into the integrated circuit based on at least one of: a difference between the first test result and the second test result failing to satisfy a first threshold value or a difference between the first hash and the second hash failing to satisfy a second threshold.

FIG. 1 is a block diagram of a non-limiting example system 100 having a database system that provides supply chain security for chiplet manufacturing. In particular, the system 100 includes a chiplet manufacturing interface 102 and a chiplet integration interface 104 that securely manufacture and integrate a chiplet 106 into an integrated circuit. The chiplet manufacturing interface 102 and the chiplet integration interface 104 access a shared database 108, such as to store test data from tests on the chiplet 106 performed during a manufacturing process.

In one or more implementations, a chiplet 106 includes any numerical quantity of electrical circuits. In some variations, the chiplet 106 is manufactured from a silicon material in addition to, or as an alternative to, any other type of material. For example, the chiplet 106 includes multiple layers, each layer having a defined set of material properties. The layers include insulating layers, dielectric layers, and/or conductive layers, such as metal layers. A manufacturing process for an integrated circuit includes combining multiple chiplets 106 to form the integrated circuit. In one or more implementations, the manufacturing process includes selecting one or more different types of chiplets 106 to combine, such that the integrated circuit performs one or more computer processing functionalities. The chiplets 106 that make up the integrated circuit operate concurrently to perform the one or more computer processing functionalities. Example computing processes performed by a chiplet 106 include, but are not limited to, central processing unit processes, input/output interface processes, analog processes, compute processes, processes for storing data at least temporarily, and so forth.

Each chiplet is assigned a chiplet identifier, which is a unique value in space and time (e.g., location of manufacture and time of manufacture). In one or more implementations, one of the chiplet manufacturing interface 102 or the chiplet integration interface 104 assigns the chiplet identifier. In one or more other implementations, the chiplet identifier is preconfigured, and the chiplet manufacturing interface 102 and the chiplet integration interface 104 are informed of the chiplet identifier. In variations, the chiplet identifier is printed on a physical location of the chiplet 106, is stored on the chiplet 106 electronically using an electronic circuit of the chiplet 106, or is recorded in any other manner.

In one or more implementations, a process for manufacturing a chiplet 106 and a process for integrating the chiplet 106 into the integrated circuit are separate processes. That is, the chiplet manufacturing interface 102 is in a different physical location than the chiplet integration interface 104, the operations performed by the chiplet manufacturing interface 102 are performed using different mechanical equipment than the operations performed by the chiplet integration interface 104, and/or the operations performed by the chiplet manufacturing interface 102 are performed by a different organization (e.g., company or divisions within a same company) than the operations performed by the chiplet integration interface 104. In some variations, the chiplet 106 is physically transported from the chiplet manufacturing interface 102 to the chiplet integration interface 104. For example, the chiplet 106 is moved from a first geographic location for chiplet manufacturing to a second geographic location for chiplet integration.

The chiplet manufacturing interface 102 includes automated test equipment 110, which conducts one or more procedural tests on the chiplet 106. By way of example and not limitation, the automated test equipment 110 performs memory repair measurements, input/output timing measurements, input/output voltage measurements, power consumption curve over temperature measurements, power consumption curve over clock speeds measurements, clock jitter measurements, redundancy setting measurements, internal analog voltage measurements, critical path timing measurements, phase-locked loop trim measurements, or any combination thereof. It is to be appreciated that in variations, the automated test equipment performs different and/or additional tests without departing from the spirit or scope of the described techniques.

In one or more implementations, the automated test equipment 110 performs the tests on the chiplet 106 to obtain the measurements based on a configured, or otherwise defined, set of instructions. For example, a user operating the automated test equipment 110 programs instructions for the automated test equipment 110 to perform a selected set of tests on each chiplet 106 processed by the chiplet manufacturing interface 102.

In some variations, the chiplet manufacturing interface 102 stores the results of the tests for each chiplet 106 at test results storage 112. The test results storage 112 includes memory for recording the results from the tests the automated test equipment 110 performs on the chiplet 106. In one or more implementations, the test results storage 112 includes local memory, or a local memory cache, for the chiplet manufacturing interface 102. That is, the memory at the test results storage 112 is accessible by the chiplet manufacturing interface 102 and is not accessible by systems or devices outside of the chiplet manufacturing interface 102. Alternatively, or additionally, the test results storage 112 is remote from, but accessible to, the chiplet manufacturing interface 102 and is logically or otherwise made accessible to the chiplet manufacturing interface 102. In one or more implementations, such remote storage is configured to limit (e.g., prevent) access by other entities, e.g., the chiplet integration interface 104.

In one or more implementations, the chiplet manufacturing interface 102 applies encryption logic 114 to the test results to obtain an encrypted version of the test results. In one or more implementations, an encrypted version of the test results is referred to as "encrypted data." Alternatively or additionally, such encrypted data includes other encrypted information, such as one or more encrypted hashes generated from the test results. In some variations, the chiplet manufacturing interface 102 applies a hash function to the test results prior to encrypting the test results. In at least one example, the hash function is a mathematical function that converts digital data into an output string with a fixed number of characters. The output of the hash function is referred to as a hash. Example hash functions include, but are not limited to, a secure hash algorithm, a message-digest algorithm, and a Whirlpool algorithm, to name a few. In variations, the chiplet manufacturing interface 102 uses a different hash function without departing from the spirit or scope of the described techniques.

In one or more implementations, the encryption logic 114 includes logic to cryptographically sign the test results and/or the hash of the test results. In one or more implementations, signature encryption logic (e.g., algorithms) is used by multiple entities to mutually authenticate cryptographic keys to secure data. Example signature encryption algorithms include, but are not limited to, a digital signature algorithm, a Rivest-Shamir-Adleman algorithm, an elliptic curve digital signature algorithm, and an Edwards-curve digital signature algorithm, to name just a few. In at least one variation, the cryptographic keys are common to the chiplet manufacturing interface 102 and the chiplet integration interface 104.

In at least one variations, the chiplet manufacturing interface 102 and the shared database 108 are coupled via a wired or wireless connection. Similarly, the automated test equipment 110 and the test results storage 112 are coupled via a wired or wireless connection. Example wired connections include, but are not limited to, buses connecting the automated test equipment 110, the test results storage 112, the chiplet manufacturing interface 102, and the shared database 108. Example wireless connections include, but are not limited to, Wi-Fi connections, cellular connections, Bluetooth connections, or any other wireless connection.

The chiplet manufacturing interface 102 completes a manufacturing process for a chiplet 106 and sends (e.g., physically transports) the chiplet 106 to a chiplet integration interface 104. The manufacturing process includes fabricating the electronic circuits of the chiplet 106, performing functionality tests on the chiplet 106, and storing the test results in the shared database 108. The chiplet integration interface 104 includes automated test equipment 116, which performs similar functionality and includes similar features to the automated test equipment 110. For example, the automated test equipment 116 conducts procedural tests on the chiplet 106. In one or more implementations, the tests include the same tests performed by the automated test equipment 110. In one or more other implementations, the tests include additional, or alternative, tests compared with the tests performed by the automated test equipment 110. The automated test equipment 116 is configured with instructions to perform the tests on one or more of the chiplets 106 (e.g., each chiplet) processed by the chiplet integration interface 104.

The chiplet manufacturing interface 102 stores the results of the tests for each chiplet 106 tested at a test results storage 118, which performs similar functionality and includes similar features to the test results storage 112. For example, the test results storage 118 includes memory for recording the results from the tests the automated test equipment 116 performs on the chiplet 106. In one or more implementations, the test results storage 118 includes local memory for the chiplet integration interface 104. That is, the memory at the test results storage 118 is accessible by the chiplet integration interface 104 and is not accessible by systems or devices outside of the chiplet integration interface 104. Alternatively, or additionally, the test results storage 118 is remote from, but accessible to, the chiplet integration interface 104 and is logically or otherwise made accessible to the chiplet integration interface 104. In one or more implementations, such remote storage is configured to limit (e.g., prevent) access by other entities, e.g., the chiplet manufacturing interface 102.

In one or more implementations, the shared database 108 is configured to be accessible by the chiplet integration interface 104 and the chiplet manufacturing interface 102. In at least one variation, a server for the shared database 108 is maintained by the chiplet manufacturing interface 102. Alternatively, or in addition, the server for the shared database 108 is maintained by the chiplet integration interface 104. Alternatively, or in addition, the shared database 108 is maintained by a third-party, such as a web services platform. The shared database 108 is configured to authorize access by the chiplet manufacturing interface 102 and the chiplet integration interface 104. In one or more implementations, other devices and/or systems are not authorized to access the shared database 108. Thus, the shared database 108 is secure from external security threats.

The chiplet manufacturing interface 102, the chiplet integration interface 104, or both write and read data to and from the shared database 108. In one or more implementations, the chiplet manufacturing interface 102 writes, or stores, encrypted data 120 at the shared database 108. For example, the chiplet manufacturing interface 102 encrypts the data using the encryption logic 114, which is described in further detail with respect to FIG. 2. Additionally, or alternatively, the chiplet integration interface 104 reads, or otherwise accesses, encrypted data 122. In some examples, the encrypted data 120 is the same as the encrypted data 122. In some other examples, the encrypted data 120 includes additional, or alternative, data when compared with the data in the encrypted data 122. The encrypted data 120, the encrypted data 122, or both include encrypted and/or non-encrypted test results from the automated test equipment 110.

In one or more implementations, the chiplet manufacturing interface 102 writes, or stores, the data (e.g., the test results) without encryption (e.g., in addition to the encrypted data), the chiplet identifier for each chiplet 106, or both at the shared database 108. The chiplet integration interface 104 reads, or otherwise accesses, the data and/or the chiplet identifier for each chiplet 106.

The chiplet integration interface 104 applies decryption logic 124 to the encrypted data. In one or more implementations, the chiplet integration interface 104 accesses the shared database 108 to retrieve the test results from the tests performed by the chiplet manufacturing interface 102 and generates a hash of test results produced by the chiplet manufacturing interface 102 using a hash function. For example, the chiplet integration interface 104 uses a same hash function as a hash function used by the chiplet manufacturing interface 102 to generate the hash of test results obtained by the chiplet manufacturing interface 102, e.g., from the automated test equipment 116 of the chiplet integration interface 104. In some variations, the decryption logic 124 includes signature decryption logic using a same, or complimentary, signature decryption algorithm as the signature encryption algorithm of the encryption logic 114.

In the context of securely manufacturing and integrating chiplets 106, including using a shared database 108 to store and access test data, consider the following discussion.

FIG. 2 depicts a non-limiting example 200 in which a chiplet supply chain uses data encryption techniques to securely manufacture an integrated circuit.

The illustrated example 200 includes, or is implemented by, a chiplet manufacturing interface 102, a chiplet integration interface 104, a chiplet 106, and a shared database 108 from FIG. 1. For example, chiplet manufacturing interface 202, chiplet integration interface 204, chiplet 206, and shared database 208 are examples of the chiplet manufacturing interface 102, the chiplet integration interface 104, the chiplet 106, and the shared database 108, respectively, as described with reference to FIG. 1.

In one or more implementations, an integrated circuit manufacturing process includes manufacturing multiple chiplets 206 and combining the chiplets 206 into a single system. The system, in some examples, is a system-on-chip, which is an integrated circuit that integrates components of a computer or other electronic system. In some variations, a process for manufacturing the chiplets 206 is separate from a process for integrating the chiplets 206 into the single system. For example, an integrated circuit manufacturer manufactures the chiplets 206 at a different geographical location than a geographical location where the chiplets 206 are integrated, uses a different mechanical equipment than a mechanical equipment used for integrating the chiplets 206, and/or purchases the chiplets 206 from a chiplet manufacturer that is separate from the organization that integrates the chiplets.

However, manufacturing the chiplets 206 separate from integrating the chiplets 206 leaves opportunity for security attacks and/or the introduction of defective chiplets into the integrated circuit manufacturing process. In one or more scenarios, for instance, the chiplets 206 are physically transported from a manufacturing location to an assembly, or integration, location. The chiplets 206 are not secure during the transportation, and are susceptible to malware, ransomware, replacement with defective or knockoff chiplets, or any other type of security attack. Additionally, or alternatively, the chiplets 206 are not secure at the manufacturing facility. Further, currently there is no process to verify that the chiplets 206 are not tampered with prior to integrating the chiplets 206 into the integrated circuit. Thus, if a chiplet 206 is tampered with or defective, there is a possibility that the chiplet 206 corrupts the entire system.

In one or more implementations, to reduce, or prevent, integrating chiplets 206 that have been tampered with and/or that are defective into an integrated circuit, the chiplet manufacturing interface 202 and the chiplet integration interface 204 use the shared database 208 to verify test data for the chiplet 206. At 210, the chiplet manufacturing interface 202 performs one or more tests on one or more of the chiplets 206 (e.g., each chiplet 206) after a fabrication process (e.g., memory repair measurements, input/output timing measurements, input/output voltage measurements, power consumption curve over temperature measurements, power consumption curve over clock speeds measurements, clock jitter measurements, redundancy setting measurements, internal analog voltage measurements, critical path timing measurements, phase-locked loop trim measurements, any combination thereof, and/or other tests). At 212, the chiplet manufacturing interface 202 obtains the test results from the tests on each chiplet 206. For example, a processor of the chiplet manufacturing interface 202 communicates with automated test equipment, with a memory cache that includes test results storage, or both to request the test results. The automated test equipment is an example of the automated test equipment 110 and the memory cache is an example of tests results storage 112 as described with reference to FIG. 1.

At 214, the chiplet manufacturing interface 202 generates a hash of the test results using a hash function. Example hash functions include, but are not limited to, a secure hash algorithm, a message-digest algorithm, and a Whirlpool algorithm, to name just a few. In one or more implementations, the hash function is common to the chiplet manufacturing interface 202 and the chiplet integration interface 204. For example, the chiplet manufacturing interface 202 and the chiplet integration interface 204 are configured with and/or have knowledge of the particular hash function used prior to performing chiplet testing. In some variations, at 216, the chiplet manufacturing interface 202 accesses a chiplet identifier of a chiplet 206 that is being tested. In one or more implementations, the chiplet identifier is physically marked on the chiplet 206 and/or is electronically recorded on the chiplet 206. In one or more implementations, the chiplet manufacturing interface 202 accesses the chiplet identifier in parallel with performing the testing procedure. The chiplet manufacturing interface 202 generates the hash of the test results for the chiplets 206 by inputting the chiplet identifier and the test results for the chiplets 206 into the hash function.

At 218, the chiplet manufacturing interface 202 determines an integrator signing key. In some examples, the integrator signing key is a public key of a public-private key pair. The chiplet integration interface 204 uses a cryptographic signing algorithm to obtain a public key and a private key. The chiplet integration interface 204 sends the public key to chiplet manufacturers to use for encrypting data. The chiplet integration interface 204 uses the private key to decrypt the encrypted data. In one or more implementations, the private key is unique to the chiplet integration interface 204, and is not accessible by other devices, networks, or interfaces.

At 220, the chiplet manufacturing interface 202 performs a cryptographic signing procedure to encrypt the hash of the test results, the test results (e.g., without the hash function applied), the chiplet identifier, or any combination thereof using the public key. The chiplet manufacturing interface 202 stores the encrypted data, which includes the signed hash, at the shared database 208. In some examples, the chiplet manufacturing interface 202 stores non-encrypted data at the shared database 208 in addition to the encrypted data.

After manufacture, at 222, the chiplet 206 is physically transported to an integration facility or portion of a facility including a chiplet integration interface 204. At 224, the chiplet integration interface 204 performs chiplet testing, e.g., a second testing of the chiplet 206 which is in addition to the chiplet testing performed at 210 by the chiplet manufacturing interface 202. In one or more implementations, the chiplet integration interface 204 performs the same tests as the chiplet manufacturing interface 202 performs at 210. In some other implementations, the chiplet integration interface 204 performs additional, or alternative, tests when compared with the tests the chiplet manufacturing interface 202 performs at 210.

At 226, the chiplet integration interface 204 obtains the test results from the tests on each chiplet 206. For example, a processor of the chiplet integration interface 204 communicates with automated test equipment, with a memory cache that includes test results storage, or both to request the test results. The automated test equipment is an example of the automated test equipment 116 and the memory cache is an example of tests results storage 118 as described with reference to FIG. 1.

At 228, the chiplet integration interface 204 generates a hash of the test results from 212 using a hash function, such as a same hash function as the chiplet manufacturing interface 202 uses at 214 or a different hash function than the hash function the chiplet manufacturing interface 202 uses at 214. The chiplet integration interface 204 retrieves the test results from 212 via the shared database 208. At 230, the chiplet integration interface 204 accesses a chiplet identifier of a chiplet 206 that is being tested. The chiplet integration interface 204 generates the hash of the test results for the chiplets 206 (e.g., each chiplet 206) being tested by inputting the chiplet identifier and the test results for the chiplets 206 (e.g., each chiplet 206) into the hash function. At 232, the chiplet integration interface 204 obtains individual chiplet data, which includes a hash of test data for each chiplet 206 and/or a version of the test data for each chiplet 206 that has not been hashed.

The chiplet integration interface 204 also retrieves an encrypted version of the test results from the tests the chiplet manufacturing interface 202 performed at 210. The chiplet integration interface 204 retrieves the encrypted version of the test results from the shared database 208. At 234, the chiplet integration interface 204 performs a cryptographic signature verification to decrypt the encrypted version of the test results. For example, at 236, the chiplet integration interface 204 obtains an integrator cryptographic key, which includes a private key of a public-private key pair. The chiplet integration interface 204 decrypts the encrypted version of the test results using the private key in accordance with, or using, a digital signature algorithm. The decrypted test results include a hash of the test results from the hash generation at 214.

At 238, the chiplet integration interface 204 compares the hash of the test results from 226 with the hash of the test results from 212 (e.g., both hashes are from test results performed at the chiplet manufacturing interface 202) to ensure database entry integrity of the shared database 208. In some examples, the comparison includes a comparison of the test results in addition to, or instead of, a comparison of the hash of the test results.

At 240, if the difference between the test results and/or the hash of the test results satisfies a threshold value (e.g., is relatively low and/or there is no difference), then the chiplet integration interface flags the chiplet 206 as a trusted die, where a die refers to a block of semiconducting material on which a functional circuit is fabricated. At 242, if the difference between the test results and/or the hash of the test results fails to satisfy the threshold value (e.g., is relatively high and/or is not equal), then the chiplet integration interface flags the chiplet 206 as an untrusted die. In some examples, the threshold value includes, but is not limited to, a predetermined range in test results, such that if the test results fall within the predetermined range, the chiplet integration interface flags the chiplet 206 as a trusted die. In some variations, the predetermined range is defined (e.g., preconfigured, generated, determined) by the manufacturing interface, the integration interface, or is agreed upon by both the manufacturing interface and the integration interface. In one or more implementations, the predetermined range is dependent on a performance of the chiplet 206, where the predetermined range includes a range in which the chiplet 206 maintains an operational threshold or functionality threshold.

The chiplet integration interface 204 selectively integrates the chiplets 206 into an integrated circuit in accordance with the comparison. For example, if the chiplet 206 is a trusted die, then the chiplet integration interface 204 integrates the chiplet 206 into the integrated circuit. In some other examples, if the chiplet 206 is an untrusted die, then the chiplet integration interface 204 does not integrate the chiplet 206 into the integrated circuit. In one or more implementations, the chiplet integration interface 204 retests untrusted dies to confirm that the comparison fails to satisfy the threshold value. If the data from the retested chiplet 206 continues to fail to satisfy the threshold value, the chiplet integration interface 204 does not integrate the chiplet 206 into the integrated circuit. If the data from the retested chiplet 206 satisfies the threshold value, the chiplet integration interface 204 integrates the chiplet 206 into the integrated circuit.

FIG. 3 depicts a procedure 300 in an example implementation of securing a supply chain for chiplets at a chiplet integration interface. In one or more implementations, the chiplet integration interface is an example of the chiplet integration interface 104 and/or the chiplet integration interface 204 as described with reference to FIGS. 1 and 2.

First test results are obtained from at least one chiplet, such as a chiplet 106 or a chiplet 206 as described with reference to FIGS. 1 and 2 (block 302). In accordance with the principles discussed herein, the test results are obtained from automated test equipment at a chiplet integration interface (e.g., the automated test equipment 116 as described with reference to FIG. 1). In one or more implementations, the test results include one or more of memory repair measurements, input/output timing measurements, input/output voltage measurements, power consumption curve over temperature measurements, power consumption curve over clock speeds measurements, clock jitter measurements, redundancy setting measurements, internal analog voltage measurements, critical path timing measurements, phase-locked loop trim measurements, any combination thereof, and/or other test results. By way of example, the chiplet manufacturing interface instructs the automated test equipment to perform at least one test from a list of relevant tests for the at least one chiplet.

In one or more implementations, the chiplet integration interface stores the first test results from block 302 in local storage (e.g., test results storage 118 as described with reference to FIG. 1). The local storage is memory managed by the chiplet integration interface.

An encrypted version of second test results is retrieved from a database (e.g., the shared database 108 and/or the shared database 208 as described with reference to FIGS. 1 and 2) accessible by a chiplet manufacturing interface and a chiplet integration interface (block 304). The second test results are produced by the chiplet manufacturing interface, such as the chiplet manufacturing interface 102 and/or the chiplet manufacturing interface 202 as described with reference to FIGS. 1 and 2. By way of example, the chiplet manufacturing interface and the chiplet integration interface are wired or wirelessly connected to a server associated with the database. The chiplet integration interface transmits a request for the encrypted version of the second test results to the server associated with the database, and the server retrieves the encrypted version of the second test results from the database. The server transmits the encrypted version of the second test results to the chiplet integration interface.

The encrypted version of the second test results is decrypted to obtain a hash of the second test results and/or the second test results (block 306). In accordance with the principles discussed herein, decrypting the encrypted version of the second test results includes using decryption logic, such as the decryption logic 124 as described with reference to FIG. 1. For example, the decryption logic includes using a private key of a public-private key pair assigned to the chiplet integration interface and the chiplet manufacturing interface to decrypt the encrypted version of the second test results. In one or more implementations, the chiplet manufacturing interface uses a public key of the public-private key pair to encrypt a hash of the second test results and the second test results, and the chiplet integration interface uses the private key to decrypt the encrypted version of the second test results by verifying a cryptographic signature of the encrypted version of the second test results. The public-private key pair are derived using signature encryption algorithms.

In one or more implementations, the chiplet manufacturing interface produces the hash of the second test results using a hash function. The inputs to the hash function include the second test results, a chiplet identifier, or both for each chiplet tested and manufactured by the chiplet manufacturing interface. For example, the chiplet manufacturing interface accesses local memory of the chiplet manufacturing interface, such as the local test results storage 112 as described with reference to FIG. 1, to obtain the second test results, generates a hash of the second test results, and stores the hash and/or the second test results in the shared database for access by the chiplet integration interface.

The chiplet is selectively integrated into an integrated circuit based on a comparison of the hash of the second test results generated by the chiplet manufacturing interface and a hash of the second test results generated by the chiplet integration interface and a comparison of the second test results and the first test results (block 308). In one or more implementations, the comparison of the hashes of the second test results produces a numerical value representative of a difference between the hashes of the second test results. Additionally, or alternatively, the comparison produces a numerical value representative of a difference between second test results, which the chiplet integration interface retrieves from the database, and the first test results. Alternatively, or additionally, the comparison produces a Boolean result indicating whether the hashes of the second test results are equal.

The chiplet integration interface determines to integrate the chiplet into the integrated circuit if the difference between the hashes of the second test results satisfies (e.g., is below) a threshold value and/or the hashes are equal. Additionally, or alternatively, the chiplet integration interface determines to integrate the chiplet into the integrated circuit if the difference between the second test results and the first test results satisfies (e.g., is below) a threshold value and/or the test results are equal. If the difference between the hashes and/or the difference between the second test results and the first test results satisfy the threshold values, the second test results are relatively similar to the first test results, indicating that the chiplet is not compromised.

In contrast, the chiplet integration interface determines not to integrate the chiplet into the integrated circuit if the difference between the hashes of the second test results fails to satisfy (e.g., is above) a threshold value and/or if the hashes of the second test results are not equal. Additionally, or alternatively, the chiplet integration interface determines not to integrate the chiplet into the integrated circuit or cancels integration of the chiplet into the integrated circuit, if the difference between the second test results and the first test results fails to satisfy (e.g., is above) a threshold value and/or if the second test results and the first test results are not equal. If the difference between the hashes of the second test results and/or the difference between the second test results and the first test results fail to satisfy the threshold values, the second test results are unsuitably different from the first test results, indicating that the chiplet is compromised and/or unusable in the integrated circuit. The chiplet is compromised if the original intended functionality of the chiplet is altered.

In one or more implementations, if the difference between the second test results and the first test results fails to satisfy the threshold value, the chiplet integration interface retests the chiplet to obtain third test results. The chiplet integration interface selectively integrates the chiplet into the integrated circuit if the difference between the second test results and the third test results satisfies (e.g., is below) the threshold value and/or if they are equal.

In one or more implementations, the chiplet integration interface obtains the hash of the second test results using a hash function. In some variations, the hash function is a common hash function to the chiplet manufacturing interface and the chiplet integration interface, such that the hash function the chiplet integration interface uses to produce the hashed version of the second test results is the same as the hash function the chiplet manufacturing interface uses to produce the hashed version of the second test results. In one or more implementations, the inputs to the hash function include the second test results (e.g., obtained from the shared database), a chiplet identifier, or both for each chiplet tested and intended for integration by the chiplet integration interface.

FIG. 4 depicts a procedure 400 in an example implementation of securing a supply chain for chiplets at a chiplet manufacturing interface. In one or more implementations, the chiplet manufacturing interface is an example of the chiplet manufacturing interface 102 and/or the chiplet manufacturing interface 202 as described with reference to FIGS. 1 and 2.

Test results are obtained from at least one chiplet, such as the chiplet 106 or the chiplet 206 as described with reference to FIGS. 1 and 2 (block 402). In accordance with the principles discussed herein, the test results are obtained from automated test equipment at a chiplet manufacturing interface (e.g., an automated test equipment 110 as described with reference to FIG. 1). In at least one example, the chiplet manufacturing interface instructs the automated test equipment to perform at least one test from a list of relevant tests for the at least one chiplet. In one or more implementations, the chiplet manufacturing interface and the chiplet integration interface (e.g., the chiplet integration interface 104 and/or the chiplet integration interface 204 as described with reference to FIGS. 1 and 2) are configured to perform the same tests on the at least one chiplet. In one or more other implementations, the chiplet manufacturing interface is configured to perform additional, or alternative, tests when compared with the tests performed by the chiplet integration interface.

In one or more implementations, the chiplet manufacturing interface stores the first test results from block 302 in local storage (e.g., test results storage 112 as described with reference to FIG. 1). The local storage is memory managed by the chiplet manufacturing interface.

An encrypted version of the test results is stored at a database (e.g., the shared database 108 and/or the shared database 208 as described with reference to FIGS. 1 and 2) accessible by a chiplet manufacturing interface and a chiplet integration interface (block 404). By way of example, the chiplet manufacturing interface and the chiplet integration interface are wired or wirelessly connected to a server associated with the database. The chiplet manufacturing interface transmits the encrypted version of the test results to the server associated with the database, and the server stores the encrypted version of the second test results in the database. The stored encrypted version of the test results is usable, such as by the chiplet integration interface, for a determination to integrate the chiplet into an integrated circuit.

In accordance with the principles discussed herein, the chiplet manufacturing interface encrypts the test results using encryption logic, such as the encryption logic 114 as described with reference to FIG. 1. In one or more implementations, the chiplet manufacturing interface generates a hash of the test results using a hash function. In one or more implementations, the hash function is common to the chiplet manufacturing interface and the chiplet integration interface. In at least one variation, the inputs to the hash function include the test results, a chiplet identifier, or both for each chiplet tested and manufactured by the chiplet manufacturing interface. For example, the chiplet manufacturing interface accesses the local memory of the chiplet manufacturing interface to obtain the test results, generates a hash of the test results, and stores the test results in the shared database for access by the chiplet integration interface.

In one or more implementations, the chiplet manufacturing interface further uses encryption logic to sign the test results, the hash of the test results, or both with a public key of a public-private key pair assigned to the chiplet integration interface and the chiplet manufacturing interface. In one or more implementations, the chiplet manufacturing interface uses a public key of the public-private key pair to encrypt the hash of the test results and/or the test results, and the chiplet integration interface uses the private key to decrypt the encrypted version of the test results by verifying a cryptographic signature of the encrypted version of the test results. The public-private key pair are derived using signature encryption algorithms.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the chiplet manufacturing interface 102, the chiplet integration interface 104, the chiplet 106, and the shared database 108) are implemented in any of a variety of different manners such as hardware circuitry, software or firmware executing on a programmable processor, or any combination of two or more of hardware, software, and firmware. The methods provided are implemented in any of a variety of devices, such as a general-purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit, and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A system comprising:
a chiplet integration interface to:
    receive a first test result from testing at least one chiplet;
    retrieve, from a database, encrypted data, wherein a second test result and a first hash associated with the second test result are encrypted in the encrypted data;
    decrypt the encrypted data;
    generate a second hash based on decrypting the second test result in the encrypted data; and
    selectively integrate the at least one chiplet into an integrated circuit based on a comparison of the first test result and the second test result and a comparison of the first hash and the second hash.

2. The system of claim 1, wherein the first hash and the second hash are generated using a same hash function, and wherein an input to the same hash function comprises the second test result.

3. The system of claim 2, wherein the input further comprises a chiplet identifier associated with the at least one chiplet.

4. The system of claim 1, wherein the chiplet integration interface comprises:
    automated test equipment to perform one or more tests on the at least one chiplet, the one or more tests producing the first test result; and
    decryption logic to decrypt the encrypted data by verifying a cryptographic signature of the encrypted data using a private key of a public and private key pair.

5. The system of claim 1, wherein to selectively integrate the at least one chiplet into the integrated circuit, the chiplet integration interface is configured to integrate the at least one chiplet into the integrated circuit based on a difference between the first test result and the second test result satisfying a first threshold value and a difference between the first hash and the second hash satisfying a second threshold value.

6. The system of claim 1, wherein to selectively integrate the at least one chiplet into the integrated circuit, the chiplet integration interface is configured to cancel integration of the at least one chiplet into the integrated circuit based on at least one of: a difference between the first test result and the second test result failing to satisfy a first threshold value or a difference between the first hash and the second hash failing to satisfy a second threshold value.

7. The system of claim 6, wherein the chiplet integration interface is configured to:
    receive a third test result from testing the at least one chiplet based on the difference between the first test result and the second test result failing to satisfy the first threshold value or the difference between the first hash and the second hash failing to satisfy the second threshold value; and
    selectively integrate the at least one chiplet into the integrated circuit based on a comparison of the second test result and the third test result.

8. The system of claim 1, wherein to selectively integrate the at least one chiplet into the integrated circuit, the chiplet integration interface is further configured to retrieve, from the database, the second test result.

9. The system of claim 1, wherein at least one of the first test result or the second test result comprises at least one of memory repair measurements, input/output timing measurements, input/output voltage measurements, power consumption curve over temperature measurements, power consumption curve over clock speeds measurements, clock jitter measurements, redundancy setting measurements, internal analog voltage measurements, critical path timing measurements, or phase-locked loop trim measurements.

10. A system comprising:
a chiplet manufacturing interface to:
    receive a test result from testing at least one chiplet; and
    store, at a database, encrypted data, wherein the test result and a first hash associated with the test result are encrypted in the encrypted data, and wherein the stored encrypted data is usable for a determination to integrate the at least one chiplet into an integrated circuit based on a comparison of the first hash to a second hash associated with the test result.

11. The system of claim 10, wherein the first hash and the second hash are generated using a same hash function, wherein an input to the same hash function comprises the test result.

12. The system of claim 11, wherein the input further comprises a chiplet identifier associated with the at least one chiplet.

13. The system of claim 10, wherein the chiplet manufacturing interface comprises:

automated test equipment to perform one or more tests on the at least one chiplet, the one or more tests producing the test result; and encryption logic to sign the test result with a public key of a public and private key pair corresponding to the chiplet manufacturing interface and a chiplet integration interface to produce the encrypted data.

14. The system of claim 10, wherein the test result comprises at least one of memory repair measurements, input/output timing measurements, input/output voltage measurements, power consumption curve over temperature measurements, power consumption curve over clock speeds measurements, clock jitter measurements, redundancy setting measurements, internal analog voltage measurements, critical path timing measurements, or phase-locked loop trim measurements.

15. A method comprising:

receiving a first test result from testing at least one chiplet;

retrieving, from a database, encrypted data, wherein a second test result and a first hash associated with the second test result are encrypted in the encrypted data;

decrypting the encrypted data;

generating a second hash based on decrypting the second test result in the encrypted data; and selectively integrating the at least one chiplet into an integrated circuit based on a comparison of the first test result and the second test result and a comparison of the first hash and the second hash.

16. The method of claim 15, wherein the first hash and the second hash are generated using a same hash function, and wherein an input to the same hash function comprises the second test result.

17. The method of claim 16, wherein the input further comprises a chiplet identifier associated with the at least one chiplet.

18. The method of claim 15, further comprising:

decrypting the encrypted data by verifying a cryptographic signature of the encrypted data using a private key of a public and private key pair corresponding to a chiplet manufacturing interface and a chiplet integration interface.

19. The method of claim 15, wherein selectively integrating the at least one chiplet into the integrated circuit comprises:

integrating the at least one chiplet into the integrated circuit based on a difference between the first test result and the second test result satisfying a first threshold value and a difference between the first hash and the second hash satisfying a second threshold value.

20. The method of claim 15, wherein selectively integrating the at least one chiplet into the integrated circuit comprises:

canceling integration of the at least one chiplet into the integrated circuit based on at least one of: a difference between the first test result and the second test result failing to satisfy a first threshold value or a difference between the first hash and the second hash failing to satisfy a second threshold.

* * * * *